United States Patent
Mische (10) Patent No.: US 10,971,836 B2
(45) Date of Patent: *Apr. 6, 2021

(54) PRINTED CIRCUIT BOARD WITH EMBEDDED LATERAL CONNECTOR

(71) Applicant: Amazon Technologies, Inc., Seattle, WA (US)

(72) Inventor: William Mische, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/672,122

(22) Filed: Nov. 1, 2019

(65) Prior Publication Data

US 2020/0067219 A1    Feb. 27, 2020

Related U.S. Application Data

(63) Continuation of application No. 15/812,756, filed on Nov. 14, 2017, now Pat. No. 10,476,188.

(51) Int. Cl.
*H01R 12/72* (2011.01)
*H01R 12/71* (2011.01)
(Continued)

(52) U.S. Cl.
CPC .......... *H01R 12/716* (2013.01); *H01R 12/73* (2013.01); *H01R 13/52* (2013.01); *H01R 43/002* (2013.01);
(Continued)

(58) Field of Classification Search
CPC .... H01R 12/721; H01R 12/722; H01R 3/403; H01R 1/184
See application file for complete search history.

(56) References Cited

U.S. PATENT DOCUMENTS 3,314,128 A * 4/1967 Jurgen ................... H05K 3/403
29/843
4,716,494 A   12/1987 Bright et al.
(Continued)

FOREIGN PATENT DOCUMENTS

DE          19523364 A1 * 1/1996 ............. H05K 3/403
DE      102007039064       2/2009
(Continued)

OTHER PUBLICATIONS

Final Office Action dated Dec. 23, 2019 for U.S. Appl. No. 15/711,707 "Printed Circuit Board With Heat Sink" Mische, 19 pages.
(Continued)

*Primary Examiner* — Tho D Ta
(74) *Attorney, Agent, or Firm* — Lee & Hayes, P.C.

(57) ABSTRACT

Printed circuit boards (PCBs) may include embedded lateral connectors. The embedded lateral connectors may be configured to enable components to quickly couple to or plug into a PCB, thus saving time to form connections. The embedded lateral connectors may also reduce weight and/or size by avoiding need for bulky tradition collections with conventional components (e.g., solders, external pin connectors, etc.). The connectors may include male connectors, female connectors, and/or mounting connectors. The connectors may be configured to connect multiple PCBs together, such as using a stacked configuration, which may enable reducing a volume of space needed in a housing for the PCBs.

20 Claims, 10 Drawing Sheets

Section A-A (51) Int. Cl.

| | | |
|---|---|---|
| *H01R 12/73* | (2011.01) | |
| *H05K 1/11* | (2006.01) | |
| *H01R 43/00* | (2006.01) | |
| *H05K 1/03* | (2006.01) | |
| *H01R 13/52* | (2006.01) | |
| *H05K 3/40* | (2006.01) | |
| *H05K 1/14* | (2006.01) | |
| *H05K 1/18* | (2006.01) | |
| *H05K 3/36* | (2006.01) | |

(52) U.S. Cl.
CPC ............ *H05K 1/036* (2013.01); *H05K 1/115* (2013.01); *H05K 1/142* (2013.01); *H05K 1/144* (2013.01); *H05K 1/148* (2013.01); *H05K 1/184* (2013.01); *H05K 3/403* (2013.01); *H01R 12/721* (2013.01); *H01R 12/722* (2013.01); *H05K 3/368* (2013.01); *H05K 2201/042* (2013.01); *H05K 2201/0919* (2013.01); *H05K 2201/09036* (2013.01); *H05K 2201/09072* (2013.01); *H05K 2201/09145* (2013.01); *H05K 2201/10189* (2013.01); *H05K 2201/10409* (2013.01)

(56) References Cited

U.S. PATENT DOCUMENTS

| | | | |
|---|---|---|---|
| 4,835,598 A | 5/1989 | Higuchi et al. | |
| 4,860,165 A | 8/1989 | Cassinelli | |
| 5,337,388 A | 8/1994 | Jacobowitz et al. | |
| 5,459,639 A | 10/1995 | Izumi | |
| 5,920,458 A | 7/1999 | Azar | |
| 6,580,611 B1 | 6/2003 | Vandentop et al. | |
| 6,665,930 B2 * | 12/2003 | Matuschik | H05K 3/403 |
| | | | 174/260 |
| 7,233,496 B2 | 6/2007 | Lee et al. | |
| 7,458,825 B2 | 12/2008 | Atsmon et al. | |
| 8,317,524 B2 | 11/2012 | Bailey | |
| 8,572,841 B2 | 11/2013 | Pedersen et al. | |
| 9,136,522 B2 | 9/2015 | Lee | |
| 9,198,278 B2 | 11/2015 | Lim et al. | |
| 9,437,943 B1 | 9/2016 | Davis | |
| 10,476,188 B2 * | 11/2019 | Mische | H05K 1/036 |
| 2006/0043581 A1 | 3/2006 | Prokofiev | |
| 2006/0234521 A1 | 10/2006 | Uchida et al. | |
| 2008/0087456 A1 | 4/2008 | Schuette | |
| 2008/0278917 A1 | 11/2008 | Lin et al. | |
| 2010/0294546 A1 | 11/2010 | Nickel et al. | |
| 2011/0183540 A1 | 7/2011 | Keenihan et al. | |
| 2011/0273834 A1 | 11/2011 | Moriai et al. | |
| 2012/0063094 A1 | 3/2012 | Gaynes et al. | |
| 2014/0198471 A1 | 7/2014 | Kajio et al. | |
| 2015/0029674 A1 | 1/2015 | Ko et al. | |
| 2015/0201533 A1 | 7/2015 | Daughtry, Jr. et al. | |
| 2015/0257249 A1 | 9/2015 | Kim | |
| 2016/0014927 A1 | 1/2016 | Chen et al. | |
| 2016/0079696 A1 | 3/2016 | Krishnamoorthy | |
| 2016/0262259 A1 | 9/2016 | Ueyama et al. | |
| 2017/0099725 A1 | 4/2017 | Maillet, Jr. et al. | |
| 2017/0231113 A1 | 8/2017 | Anderl et al. | |
| 2019/0090343 A1 | 3/2019 | Mische | |
| 2019/0148856 A1 | 5/2019 | Mische | |

FOREIGN PATENT DOCUMENTS

| | | |
|---|---|---|
| EP | 2222145 | 8/2010 |
| JP | 2003132668 | 5/2003 |
| WO | WO2004103038 | 11/2004 |
| WO | WO2007045520 | 4/2007 |
| WO | WO2014091000 | 6/2014 |

OTHER PUBLICATIONS

Non Final Office Action dated Jan. 4, 2019 for U.S. Appl. No. 15/711,707 "Printed Circuit Board With Heat Sink" Mische, 18 pages.

Office Action for U.S. Appl. No. 15/812,756, dated Apr. 15, 2019, Mische, "Printed Circuit Board With Embedded Lateral Connector", 9 pages.

Office action for U.S. Appl. No. 15/711,707, dated Apr. 16, 2018, Mische, "Printed Circuit Board With Heat Sink", 17 pages.

Office Action for U.S. Appl. No. 15/711,707, dated Apr. 3, 2019, Mische, "Printed Circuit Board With Heat Sink", 18 pages.

Office Action for U.S. Appl. No. 15/711,707, dated Jun. 28, 2019, Mische, "Printed Circuit Board With Heat Sink", 19 pages.

Office Action for U.S. Appl. No. 15/812,756, dated Sep. 11, 2018, William Mische, "Printed Circuit Board With Embedded Lateral Connector", 12 pages.

Office Action for U.S. Appl. No. 15/711,707, dated Sep. 18, 2018, William Mische, "Printed Circuit Board With Heat Sink", 14 pages.

The PCT Search Report and Written Opinion dated Jan. 3, 2019 for PCT Application No. PCT/US2018/051429, 16 pages.

The PCT Search Report and Written Opinion dated Mar. 6, 2019 for PCT Application No. PCT/US2018/060794, 37 pages.

* cited by examiner

Section A-A

FIG. 3B

Section A-A

Section A-A

Section B-B

PRINTED CIRCUIT BOARD WITH EMBEDDED LATERAL CONNECTOR

CROSS REFERENCE TO RELATED APPLICATION

This patent application is a continuation of and claims priority to co-pending and co-owned U.S. patent application Ser. No. 15/812,756, filed Nov. 14, 2017, entitled "PRINTED CIRCUIT BOARD WITH EMBEDDED LATERAL CONNECTOR," which is hereby incorporated in its entirety by reference.

BACKGROUND

Printed circuit boards (PCBs) are formed during a manufacturing process, and then often later modified to add components, such as surface-mounted processors and other components. Some components are added to PCBs by adding solder to create electrical connections. Other components may be added by bolting through apertures formed through a thin side of a PCB, which is typically less than a few millimeters thick. Both of these processes add weight to the overall system and add bulk by increasing an overall volume of the PCB, and in particular, a thickness of the finished PCB.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

This disclosure is directed to printed circuit boards (PCBs) that include one or more embedded lateral connectors, which may be used to couple components to the PCB. The connectors (also referred to as an "interface" or a "coupler") may be formed as apertures configured to receive a plug or other corresponding solid connector (i.e., female connectors), as plugs configured to engage connector receptacles (i.e., male connectors), or a combination of both. Unlike conventional connectors that engage a PCB through a top or bottom surface, the connectors described herein are positioned in the lateral sides of the PCB and thus can project into the PCB on the order of millimeters or centimeters since PCBs have larger width and length than a thickness. Typically, a thickness of a PCB is just a few millimeters in most situations. The connector(s) may be used for data transfer, for supply of power, and/or for other electronic functions In accordance with one or more embodiments, layers used to form a PCB may be formed with one or more apertures or cutouts on some layers to accommodate placement of the embedded lateral connector(s) between at least some of the layers. The apertures may be formed by die cuts or removing material in other ways (e.g., milling, etc.), formed by printing each layer to exclude material in locations to form the aperture(s), or by other known techniques to form a layer with at least one aperture. A PCB may be formed using the layers. For example, an inner layer may be formed that includes a first planar side and a second planar side opposite the first planar side. A connector may be coupled to the inner layer such that an aperture with a longitudinal axis is oriented parallel with the first planar surface. An opening of the connector may be aligned with a side of the inner layer. The connector may create an electrical connection between the inner layer and contacts included in the connector that are configured to engage a plug. In other embodiments, the connector may be a plug, but may be formed in a similar manner. Next, a set of layers may be coupled to the first planar side of the inner layer and another set of layers may be coupled to the second planar side of the inner layer. The layers may then be adhered (e.g., glued, laminated, cured, etc.) to form a PCB having the connector embedded laterally in the PCB.

The apparatuses and techniques described herein may be implemented in a number of ways. Example implementations are provided below with reference to the following figures.

Figure 1A:
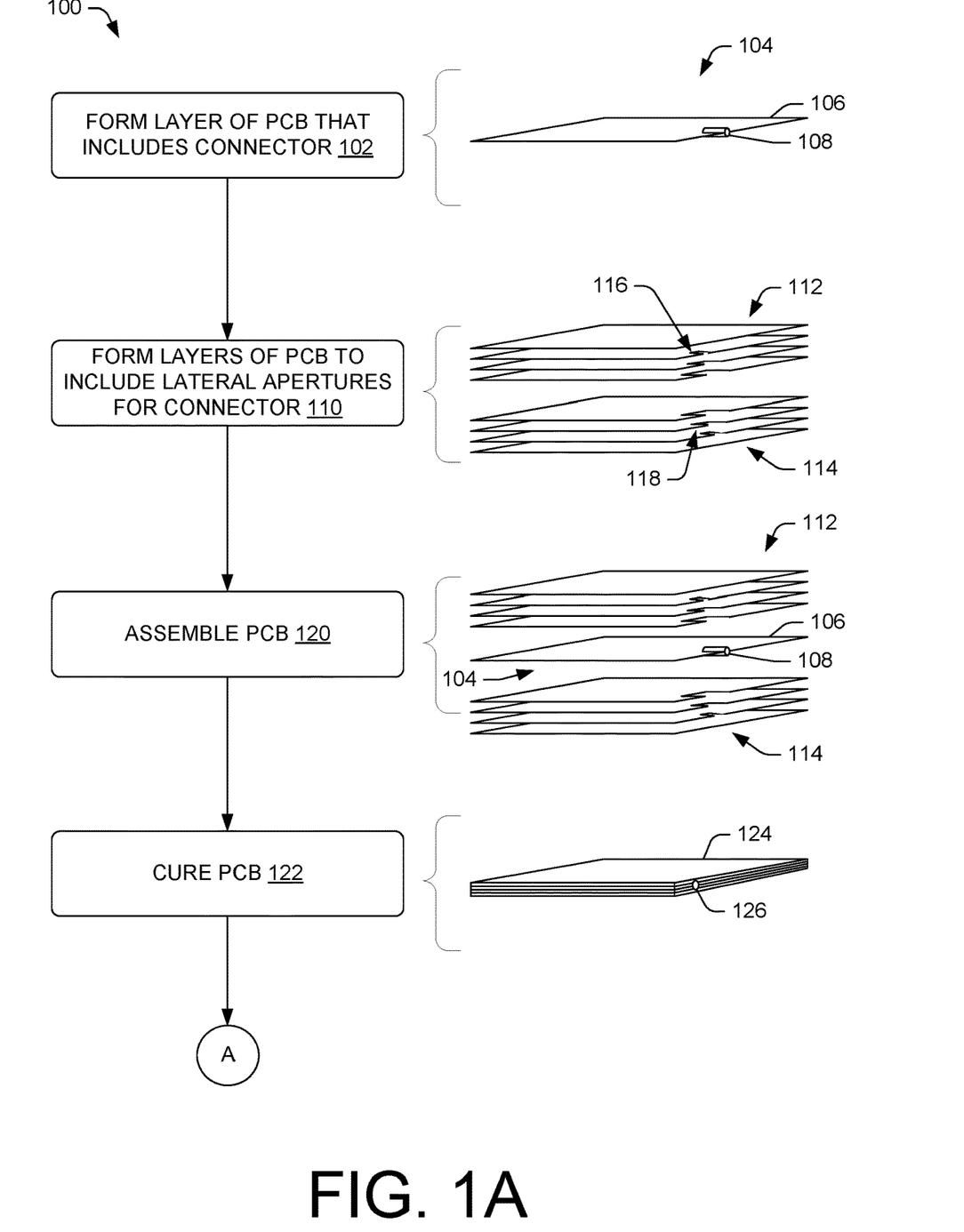
FIGS. 1A and 1B show a pictorial flow diagram describing an illustrative process to create an electronic device with a printed circuit board (PCB) that includes an embedded lateral connector.
Figure 1B:
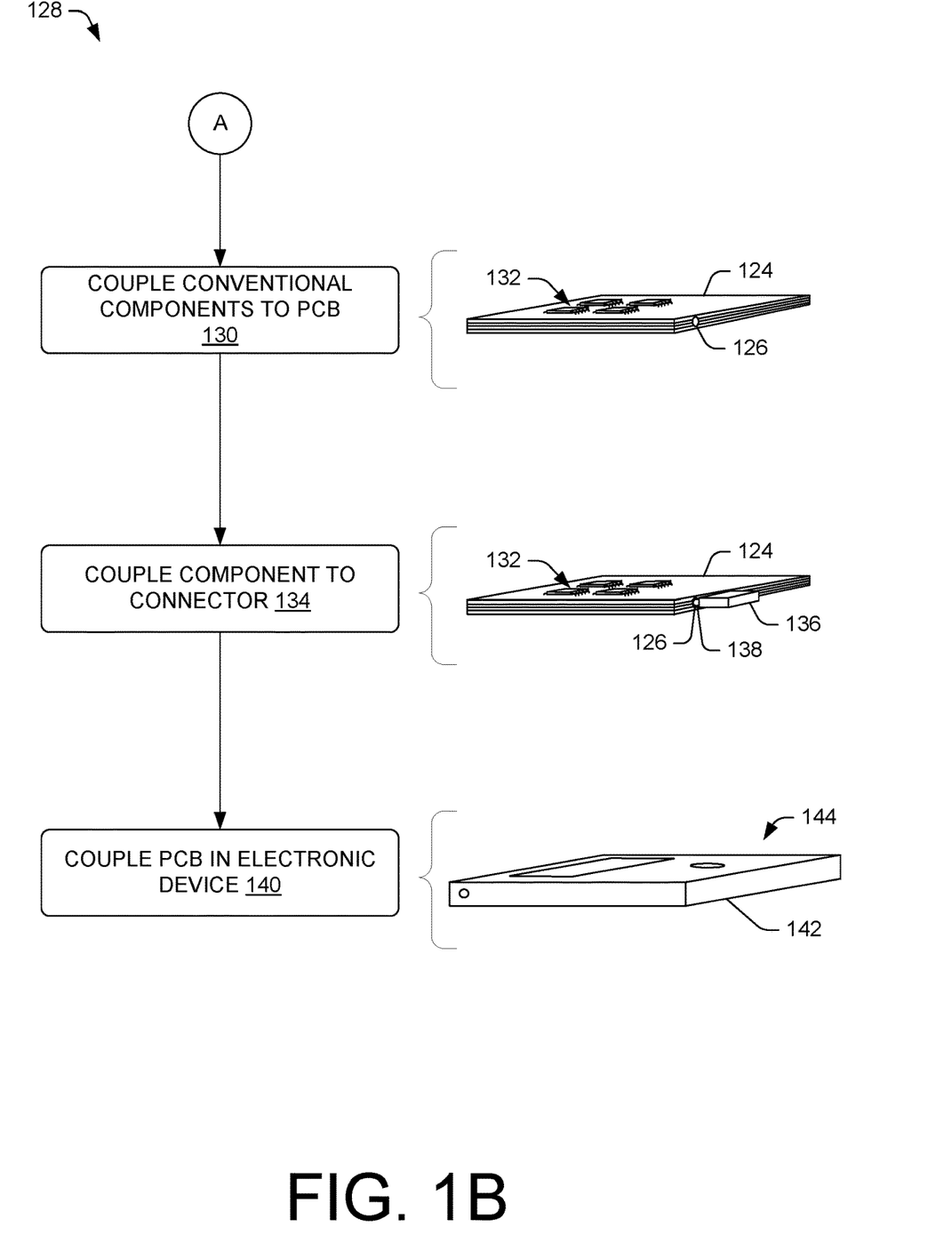

FIGS. 1A and 1B show a pictorial flow diagram describing an illustrative process to create an electronic device with a printed circuit board (PCB) that includes an embedded lateral connector. The process is illustrated as a collection of blocks in a logical flow graph, which represent a sequence of operations. The order in which the operations are described is not intended to be construed as a limitation, and any number of the described blocks can be combined in any order and/or in parallel to implement the process.

FIG. 1A shows an illustrative process 100. At 102, an inner layer 104 may be formed. The inner layer 104 may include a planar layer 106 having a top planar side and a bottom planar side. The layer may include etched or otherwise formed metallic connections on the top planar side, the bottom planar side, or both. The layers, including the planar layer 104, may be formed of insulator material, such as fiberglass (reinforces epoxy resin), plastic, or other material commonly used to form PCBs, and may include conductive materials, such as copper foil or other metallic foil or material. The planar layer 106 may include an aperture or special feature that accommodates coupling of a connector 108 to the planar layer 106 such that at least part of the connector occupies space within the plane of the planar layer 106, which is referred to herein as an aperture or special feature. In some embodiments, the layers may be formed by an additive manufacturing process that utilizes three-dimensional (3D) printing. The additive manufacturing process may omit or refrain from adding material in certain areas to form apertures or special features. In some embodiments, the layers may be machined, die cut, or otherwise processed to remove material to form the apertures or special features. The connector may be coupled to the inner layer such that a longitudinal axis of the connector is oriented parallel with the top planar surface. If the connector includes an aperture, an opening of the connector may be aligned with a side of the inner layer. The connector may create an electrical connection between the inner layer and contacts included in the connector that are configured to engage another connector, such as a plug or complementary recess (if the connector is a plug).

At 110, additional layers may be formed to create a PCB. Top layers 112 and bottom layers 114 may be created, such as using same or similar techniques used to form the planar layer 106 described above. The layers may include etched or otherwise formed metallic connections on a top side, a bottom side, or both of each layer. In some embodiments, the top layers 112 and bottom layers 114 may be mirrored versions of one another. At least some of the top layers 112 may include first apertures 116 while at least some of the bottom layers 114 may include second apertures 118, which may be a mirrored version of the first apertures 116. The first apertures 116 and the second apertures 118 may accommodate the volume of the connector, which may reside in a cavity formed by the apertures after assembly of the layers with the inner layer 104.

At 120, the top layers 112, the inner layer 104 and the bottom layers 114 may be assembled such as by stacking the layers on top of one another. When assembled the first apertures 116 and the second apertures 118 may be in alignment and may accommodate the connector 108, which may be situated between at least some of the layers and at least partly with the apertures.

At 122, the layers may be adhered (e.g., glued, laminated, cured, etc.) together to form a PCB 124 that includes an embedded lateral connector 126.

FIG. 1B shows additional processes 128 that may be performed on the PCB 124 or with the PCB 124.

At 130, conventional components 132 may be coupled to a top surface of the PCB 124, a bottom surface of the PCB 124, or both. The conventional components 132 may be coupled by solder, by threaded connectors that extend through apertures that extend through all layers of the PCB 124 in the planar surface of the PCB 124, and/or by other convention techniques. The components may include capacitors, controllers, resistors, pin connectors, and/or other types of conventional components.

At 134, a component 136 may be coupled to the embedded lateral connector 126. The component 136 may include a complementary connector 138 that is complementary to the embedded lateral connector 126 that, when joined or coupled to the embedded lateral connector 126, creates an electrical connection between the PCB 124 and the component 136. The component 136 may be a power adapter, another PCB, a display, and/or any other type of electronic component that operates by electrical interaction with the PCB. In some embodiments, the embedded lateral connector 126 may include multiple contacts, such as rings or other types of contacts, which may be designated for electrical transmission of different signals. In various embodiments, multiple embedded lateral connectors may be used to couple to the component 136. The multiple embedded lateral connectors may be a same type or may be of different types, which may desirably limit coupling position/orientation with the component 136.

At 140, the PCB 124 may be coupled to a housing 142 of an electronic device 144. The housing 142 may secure the PCB 124, such as by couplers that engage embedded lateral mounting features in the PCB, which are discussed below.

Figure 2:
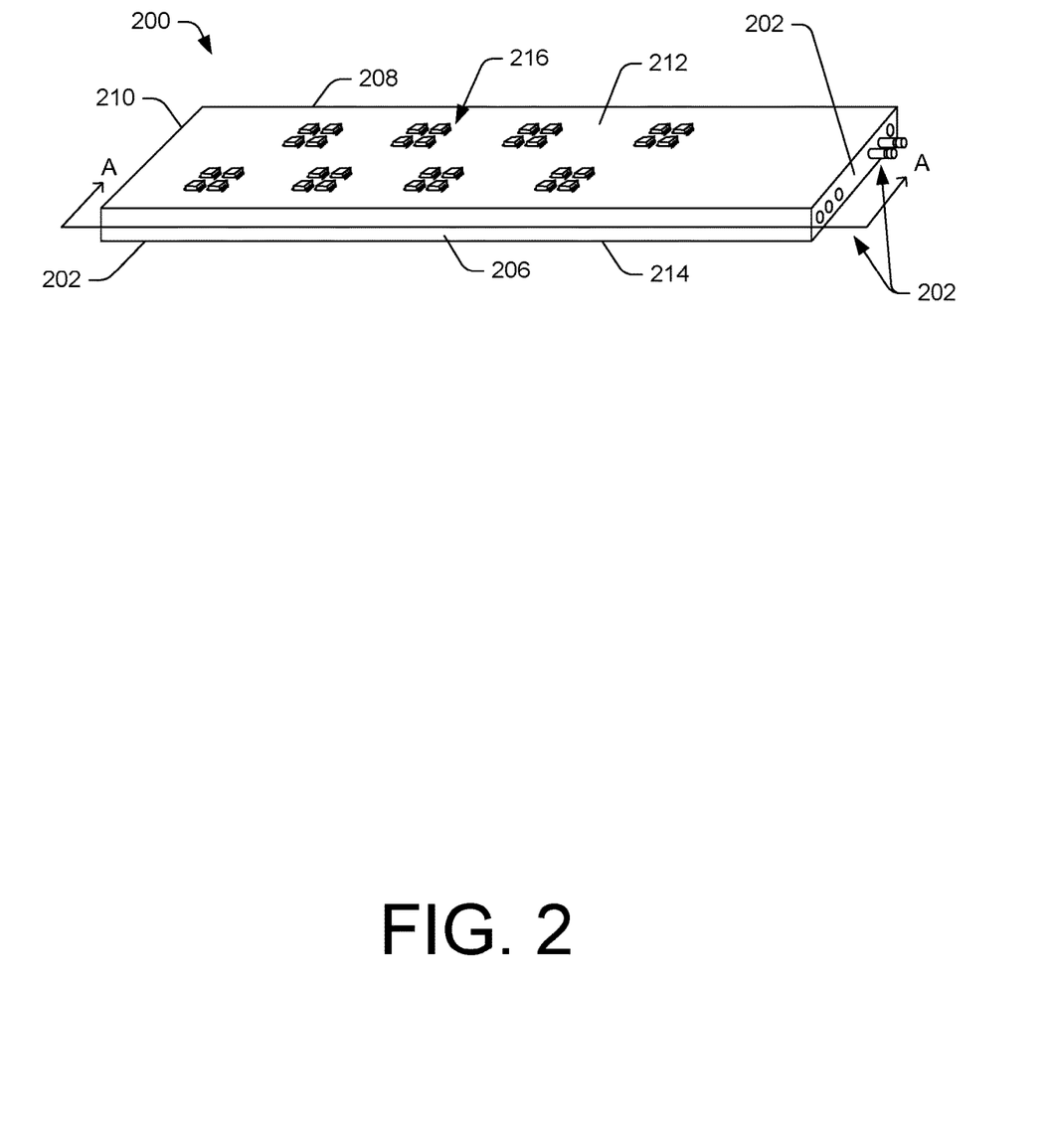
FIG. 2 is a perspective view of an illustrative PCB that includes an illustrative embedded lateral connector.

FIG. 2 is a perspective view of an illustrative PCB 200 that includes a plurality of illustrative embedded lateral connectors 202 on a first lateral side 204. In some embodiments, the PCB 200 may include additional embedded lateral connectors on one or more different lateral sides, such as a second lateral side 206, a third lateral side 208, or a fourth lateral side 210. The PCB 200 may include a top planar surface 212 and a bottom planar surface 214 opposite the top planar surface 212. Conventional components 216 may be soldered to the top planar surface 212 or otherwise coupled thereto.

Figure 3A:
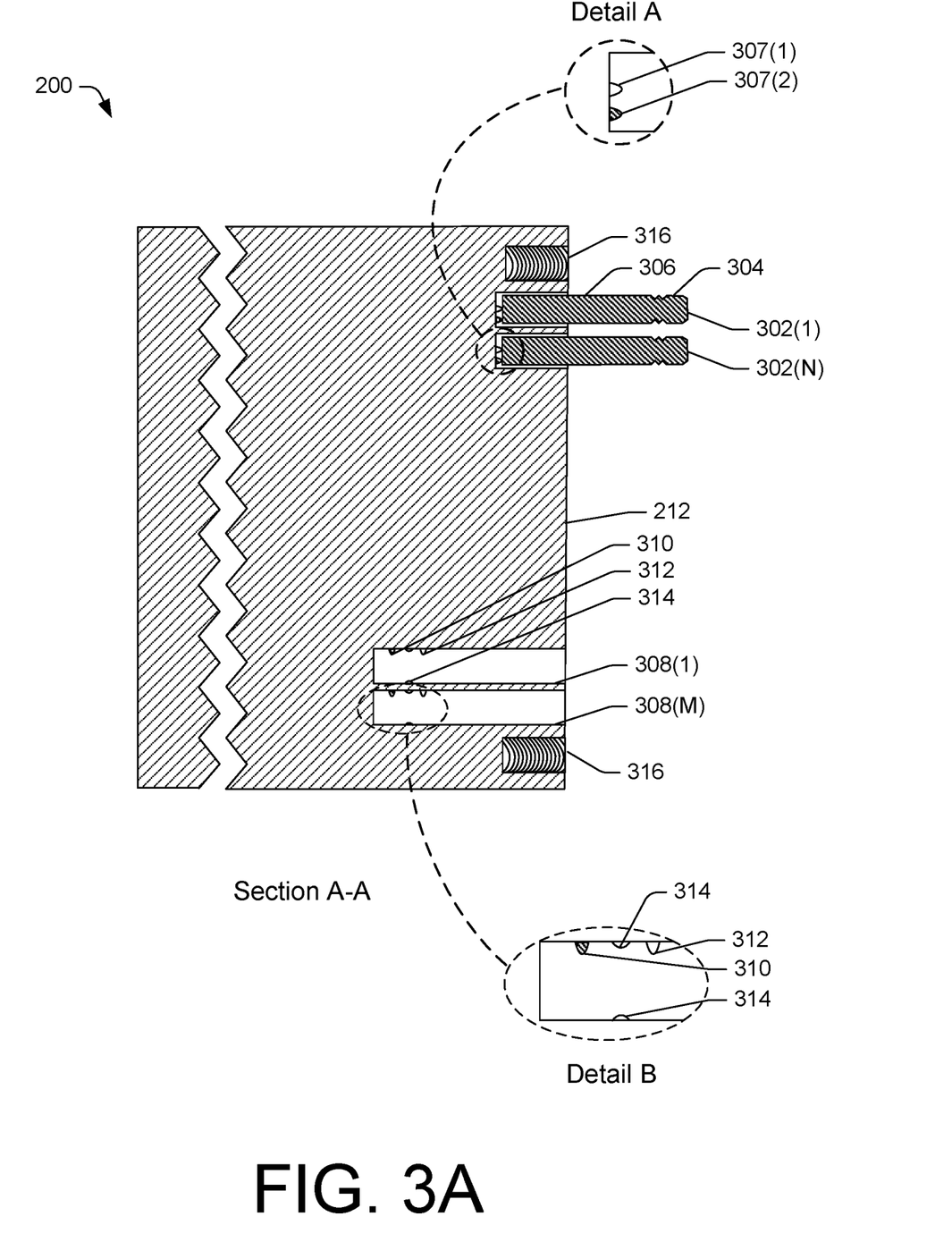
FIG. 3A shows a cross-sectional top view of the PCB shown in FIG. 2, showing illustrative details of embedded lateral connectors.

FIG. 3A shows a cross-sectional top view of the PCB 200 shown in FIG. 2, showing illustrative details of some embodiments of the embedded lateral connectors. In some embodiments, the cross-sectional top view of the PCB 200 may be a cross-sectional view of an inner layer of the PCB, such as the inner layer 104 discussed with reference to FIG. 1A.

The PCB 200 may include first connectors 302(1)-302(N), which may be plugs or other extrusions of a male-type connector. The first connectors may include tip(s) 304 and ring(s) 306, as well as a sleeve, which may be used for grounding purposes. In some embodiments, the first connectors 302 may include multiple rings, which may be separated by insulators to enable transmission of different signals. The tip(s) 304 and the ring(s) 306 include electrical connectivity to an electrical grid formed in layers in the PCB 200, as discussed above. The first connectors 302(1)-302(N) may include electrical connection with different layers of the PCB via a first contact 307(1) and a second contact 307(2) shown in Detail A, although more contacts may be used depending on factors such as a number or rings of the first connectors 302(1)-302(N). In some embodiments, a first contact 307(1) may include electrical connection with the inner layer while the second contact 307(2) may include electrical connection with a different layer, possibly an adjacent later.

The PCB 200 may include second connectors 308(1)-308(M), which may be apertures or other cavities of a female-type connector. The second connectors 308 may include first contact(s) 310 and second contact(s) 312, and possibly other contacts, which may engage rings, tips, and/or a sleeve of a corresponding connector (e.g., a plug), which are also shown in Detail B. The first contact(s) 310 and second contact(s) 312 may be formed as biasing devices (e.g., leaf spring, etc.) to enable repetitive interaction with a corresponding connector, which may cause deflection (compression) of a contact when mated with one of the second connectors 308(1)-308(M). In some embodiments, the first contact(s) 310 may include electrical connection with the inner layer while the second contact(s) 312 may include electrical connection with a different layer, possibly an adjacent later. The second connectors 308 may include retention features 314, which may engage the corresponding connector to secure the corresponding connector to one of the second connectors 308. The contacts 310 and 312 include electrical connectivity to the electrical grid formed in layers in the PCB 200, as discussed above.

In accordance with some embodiments, the PCB 200 may include mounting features 316, which may be embedded in the lateral side of the PCB. The mounting features 316 may enable coupling the PCB 200 to a housing, frame, mounting bracket, other PCB, or other component. The mounting features 316 may include treads or other features to enable corresponding parts to be securely fastened or coupled to the mounting features, such as screws. Besides threaded features, the mounting features may use a snap fit, magnets, friction fit, or other types of coupling features to secure the mounting features to another part.

Figure 3B:
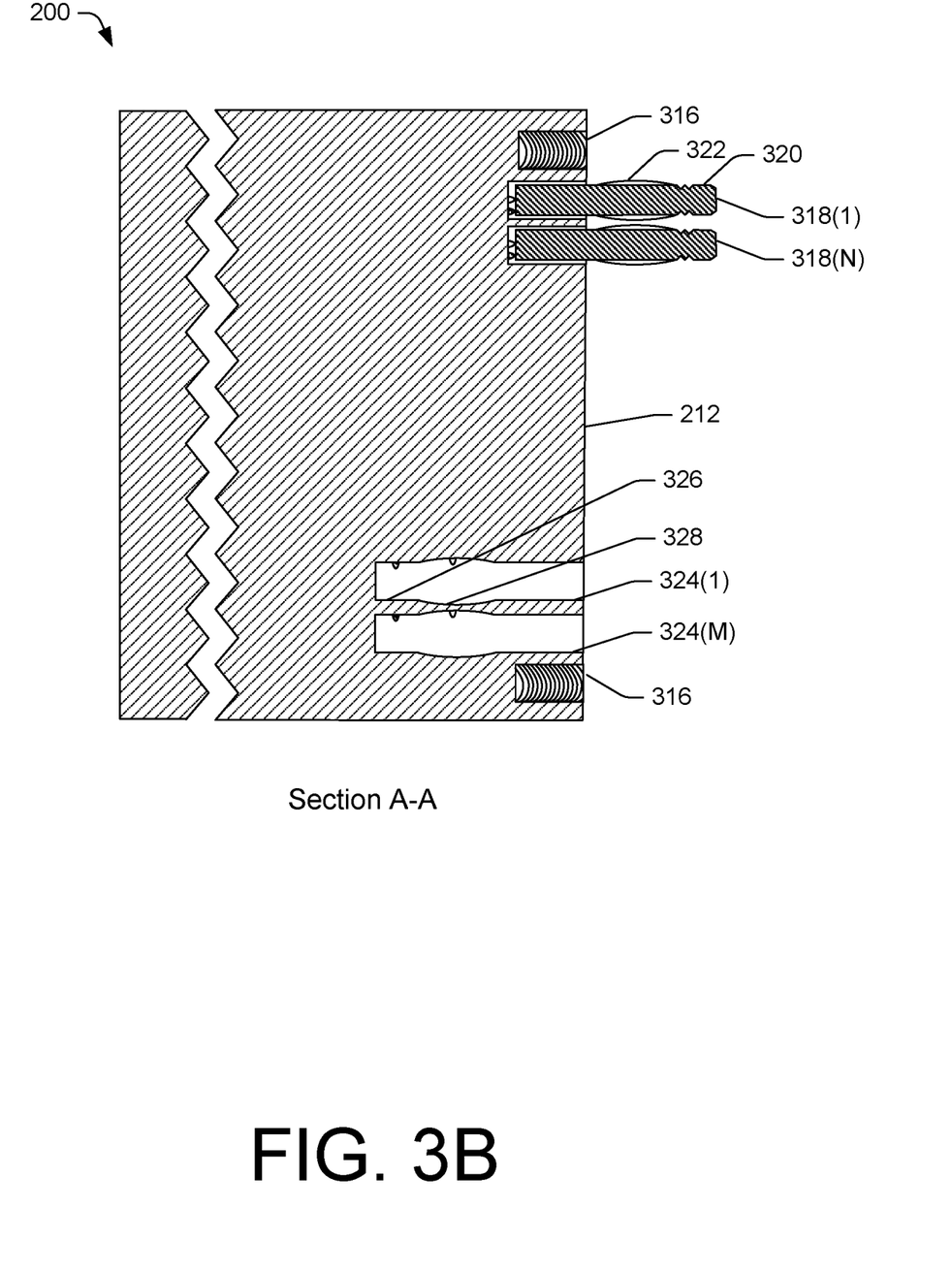
FIG. 3B shows a cross-sectional top view of the PCB shown in FIG. 2, showing illustrative details of embedded lateral connectors having retention features.

FIG. 3B shows a cross-sectional top view of the PCB shown in FIG. 2, showing illustrative details of embedded lateral connectors having retention features.

The PCB 200 may include third connectors 318(1)-318 (N), which may be plugs or other extrusions of a male-type connector. The third connectors may include tip(s) 320 and ring(s) 322, as well as a sleeve, which may be used for grounding purposes. At least some of the rings 322 may be formed as biased rings or springs, which may deflect upon entry into a corresponding connector, and then engage a corresponding recess to retain the third connector in the corresponding connector. For example, the third connectors may be similar to "banana plugs". In some embodiments, the third connectors 318 may include multiple rings, which may be separated by insulators to enable transmission of different signals. The tip(s) 320 and the ring(s) 322 include electrical connectivity to an electrical grid formed in layers in the PCB 200, as discussed above.

The PCB 200 may include fourth connectors 324(1)-324 (M), which may be apertures or other cavities of a female-type connector. The fourth connectors 324 may include first contact(s) 326 and second contact(s) 328, and possibly other contacts, which may engage rings, tips, and/or a sleeve of a corresponding connector (e.g., a plug). The second contacts 328 may be formed as a recess to act as retention features, which may engage the corresponding biased rings or springs to secure the corresponding connector to one of the fourth connectors 324. The contacts 326 and 328 include electrical connectivity to the electrical grid formed in layers in the PCB 200, as discussed above.

In accordance with some embodiments, the PCB 200 having the third connectors 318, the forth connectors 324, and/or any other connectors described herein, may include the mounting features 316, which may be embedded in the lateral side of the PCB. The mounting features 316 may enable coupling the PCB 200 to a housing, frame, mounting bracket, other PCB, or other component. The connectors described herein may include any of the contacts 307(1), 307(2), 312, and/or 314 described above with reference to FIG. 3A FIG. 3C shows a cross-sectional top view of the PCB shown in FIG. 2, showing illustrative details of some embedded lateral connectors having different retention features.

Figure 3C:
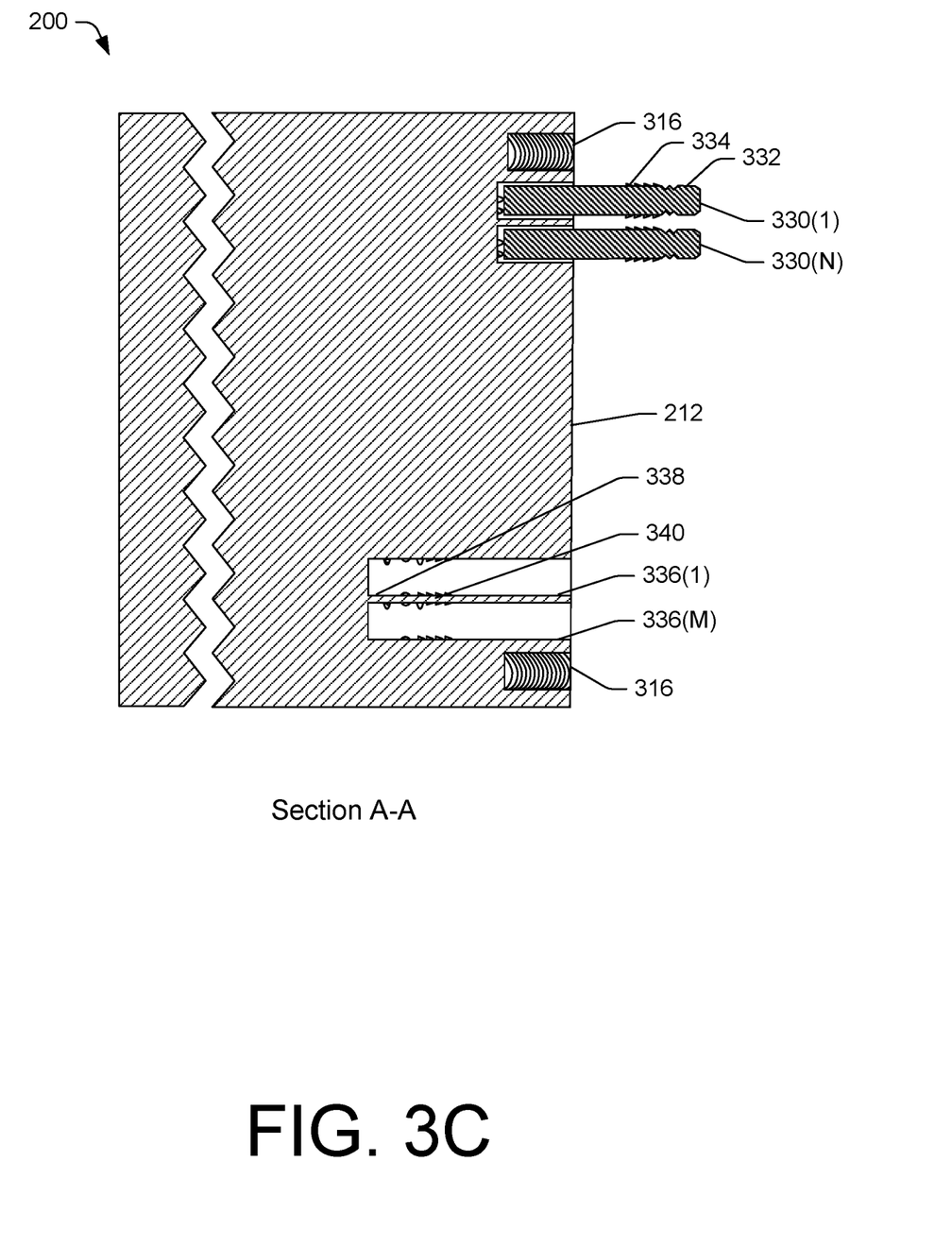
FIG. 3C shows a cross-sectional top view of the PCB shown in FIG. 2, showing illustrative details of some embedded lateral connectors having different retention features.

The PCB 200 may include fifth connectors 330(1)-330 (N), which may be plugs or other extrusions of a male-type connector. The fifth connectors may include tip(s) 332 and ring(s) 334, as well as a sleeve, which may be used for grounding purposes. At least some of the rings 334 may include directional barbs or securing features, which may enable entry into a corresponding connector, and then engage a sidewall or corresponding features or recesses to retain the fifth connector in the corresponding connector. In some embodiments, the fifth connectors 330 may include multiple rings, which may be separated by insulators to enable transmission of different signals. The tip(s) 332 and the ring(s) 334 include electrical connectivity to an electrical grid formed in layers in the PCB 200, as discussed above.

The PCB 200 may include sixth connectors 336(1)-336 (M), which may be apertures or other cavities of a female-type connector. The sixth connectors 336 may include first contact(s) 338 and second contact(s) 340, and possibly other contacts, which may engage rings, tips, and/or a sleeve of a corresponding connector (e.g., a plug). The second contacts 340 may include retention features, which may engage corresponding rings features, such as the directional barbs or securing features discussed with relation to the rings 334 to secure the corresponding connector to one of the sixth connectors 336. The contacts 338 and 340 include electrical connectivity to the electrical grid formed in layers in the PCB 200, as discussed above.

In accordance with some embodiments, the PCB 200 having the fifth connectors 330, the sixth connectors 336, and/or any other connectors described herein, may include the mounting features 316, which may be embedded in the lateral side of the PCB. The mounting features 316 may enable coupling the PCB 200 to a housing, frame, mounting bracket, other PCB, or other component. The connectors described herein may include any of the contacts 307(1), 307(2), 312, and/or 314 described above with reference to FIG. 3A FIG. 3D a schematic diagram of a first configuration 342 of a connector 344 that includes a wedge 346 inserted into a tip of the connector 342. A second configuration 348 of the connector 344 shows the wedge 346 pushed into the connector 344 along a seam to expand a diameter 350 of the tip, which flares or expands to secure the connector in a corresponding connector or receptacle, such as the corresponding connector discussed with reference to FIG. 3E, below.

Figure 3D:
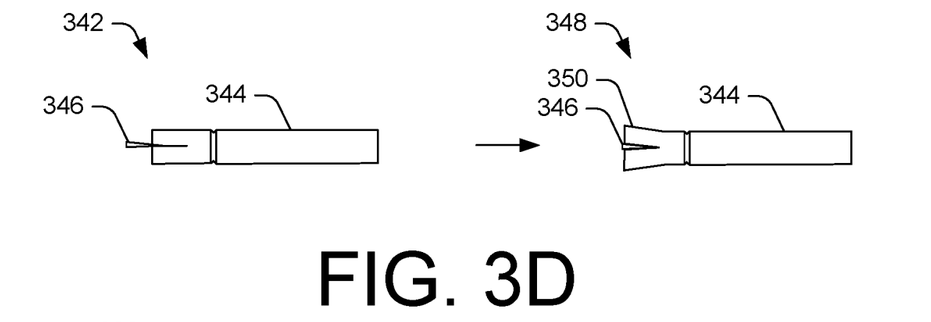
FIG. 3D a schematic diagram of a connector that includes a wedge inserted into a tip of the connector to expand a diameter of the tip to secure the connector in a receptacle.
Figure 3E:
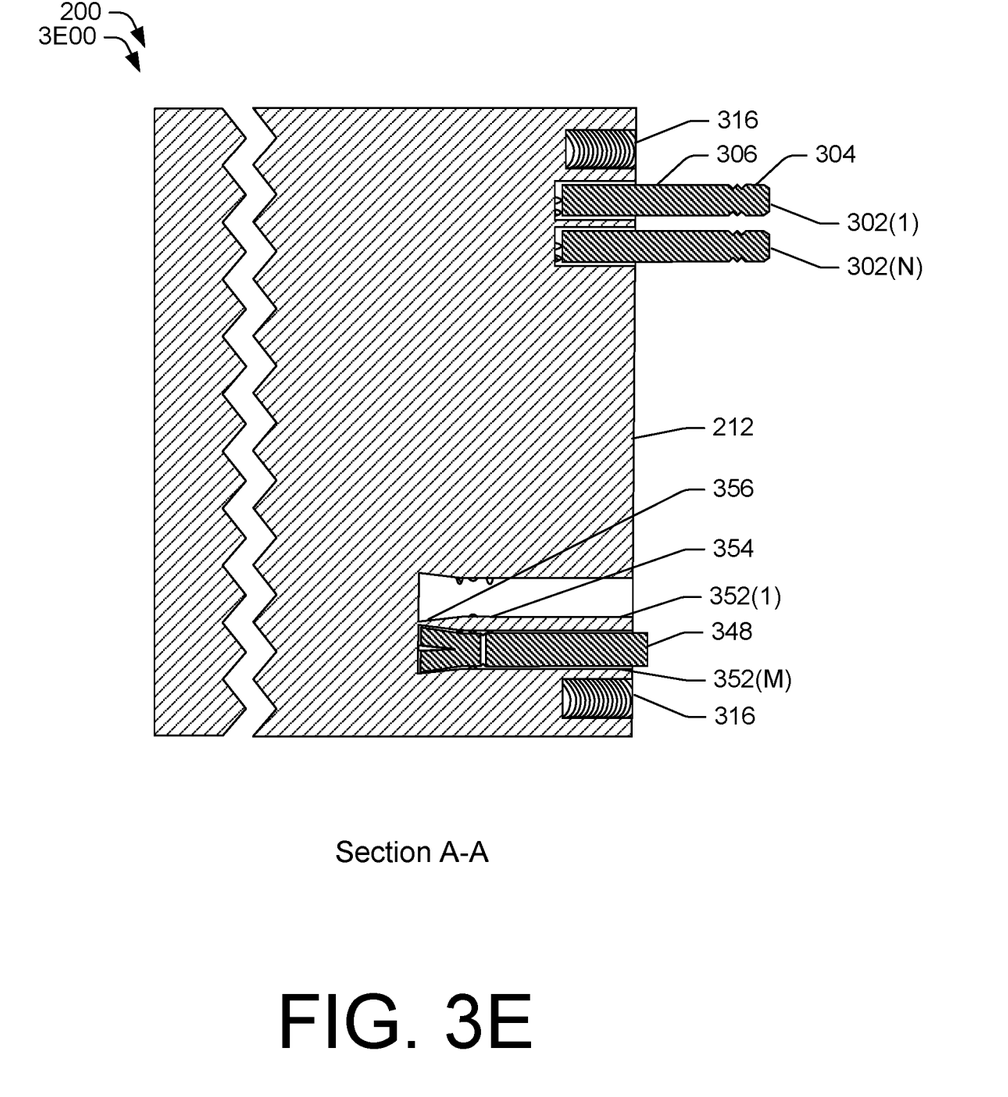
FIG. 3E shows a cross-sectional top view of the PCB shown in FIG. 2, showing illustrative details of some embedded lateral connectors utilizing a wedge retention feature for use with the connector shown in FIG. 3D.

FIG. 3E shows a cross-sectional top view of the PCB shown in FIG. 2, showing illustrative details of some embedded lateral connectors utilizing a wedge retention feature for use with the connector shown in FIG. 3D.

The PCB 200 may include seventh connectors 352(1)-352(M), which may be apertures or other cavities of a female-type connector. The seventh connectors 352 may include first contact(s) 354 and second contact(s) 356, and possibly other contacts, which may engage rings, tips, and/or a sleeve of a corresponding connector, such as the second configuration 348 of the connector 344 that includes the wedge 346 inserted into the seam (as shown in FIG. 3D). The second contacts 356 may be formed as a recess to act as retention features that engage the diameter 350 of the tip, to secure the corresponding connector to one of the seventh connectors 352. The contacts 354 and 356 include electrical connectivity to the electrical grid formed in layers in the PCB 200, as discussed above.

In accordance with some embodiments, the PCB 200 having the seventh connectors 352 and/or any other connectors described herein, may include the mounting features 316, which may be embedded in the lateral side of the PCB. The mounting features 316 may enable coupling the PCB 200 to a housing, frame, mounting bracket, other PCB, or other component. The connectors described herein may include any of the contacts 307(1), 307(2), 312, and/or 314 described above with reference to FIG. 3A FIG. 4A is a perspective view of a sealed connector pair 400 that secures a wire 402 to a PCB 404. The sealed connector pair 400 may include a housing 406, which may be coupled to a collar 408. The collar 408 may retain a sleeve 410. The sleeve 410 may retain a gasket 412, among other internal parts shown in FIG. 4B, below. The sealed connector pair 400 may enable connection of the wire 402 to electrical components of the PCB 404, while preventing or reducing exposure by the PCB 404 to environmental conditions, such as dirt, moisture, and/or other contamination.

Figure 4A:
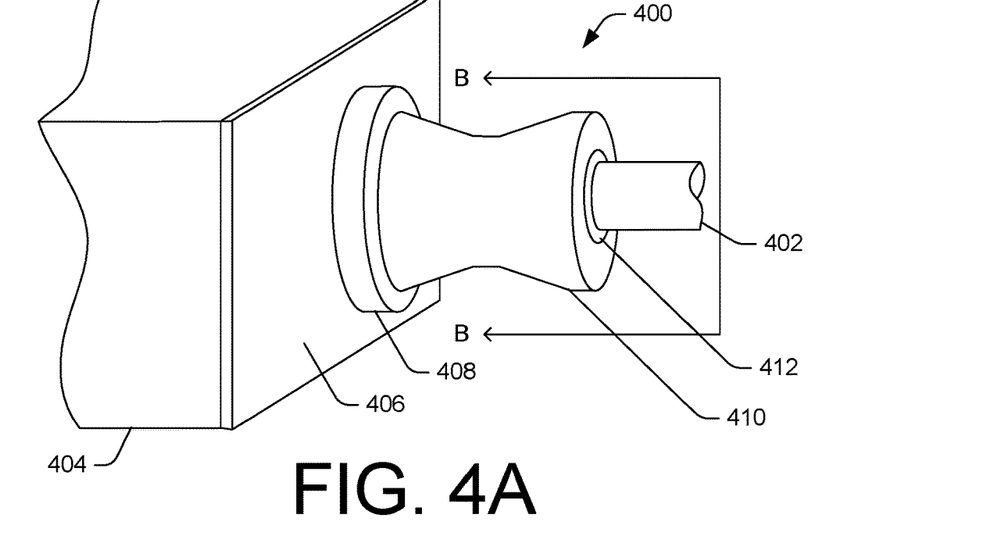
FIG. 4A is a perspective view of a sealed connector that secures a wire to a PCB.
Figure 4B:
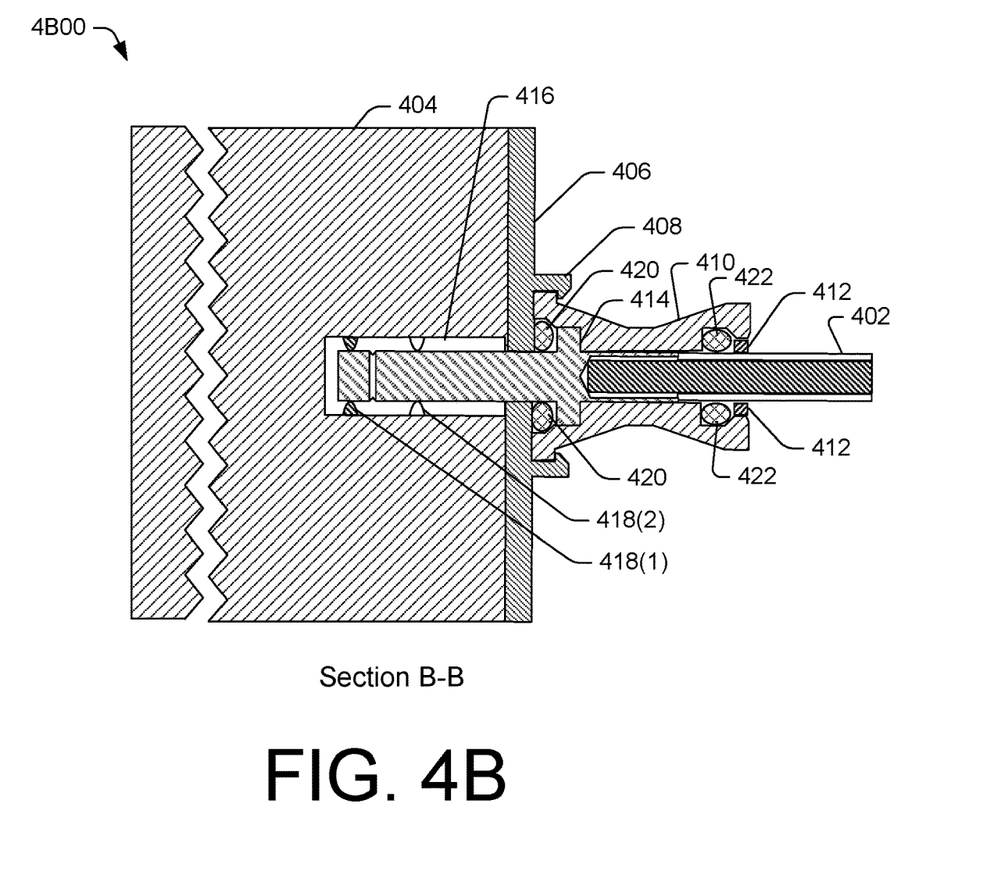
FIG. 4B is a cross-sectional side elevation view of the sealed connector shown in FIG. 4A.

FIG. 4B is a cross-sectional side elevation view of the sealed connector shown in FIG. 4A. As shown, the wire 402 may engage a connector 414, which may create an electrical connection with a connector 416 via contacts 418. The connector 414 may receive the wire 402 and retain the wire, at least in part by friction, a press fit, and/or by retaining features, such as barbs. The connector 414 may abut a first seal 420 positioned between the connector 414, the sleeve 410, and the housing 406. A second seal 422 may be positioned between the sleeve 410, the wire 402, and the gasket 412. The seals 420 and 422 may prevent or reduce exposure by the connector 416 of the PCB 404 to environmental conditions, such as dirt, moisture, and/or other contamination. Meanwhile, the sleeve 410 may be coupled to the collar 408 by clips, snap features, and/or other features to retain the sleeve, and retain the wire 402 in the connector 416. During use, the wire 402 may be coupled to the connector 414, the sleeve 410, seals 420 and 422, and the gasket 412 to form an assembly. The assembly may then be inserted through the housing 406 and into the connector 416 until the sleeve couples to the collar 408, thereby securing or retaining the wire 402 in the connector 416.

Figure 5A:
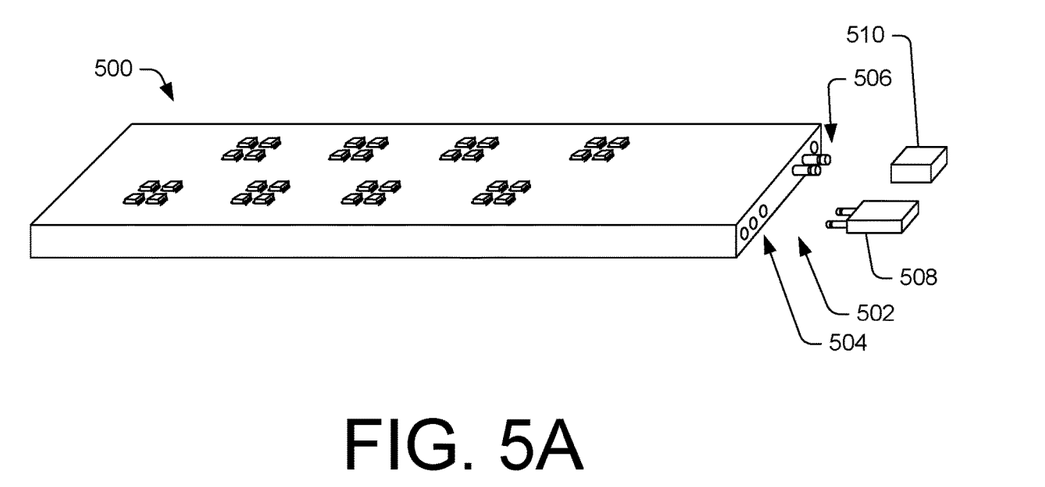
FIGS. 5A and 5B show perspective views of coupling of different components using embedded lateral connectors.
Figure 5B:
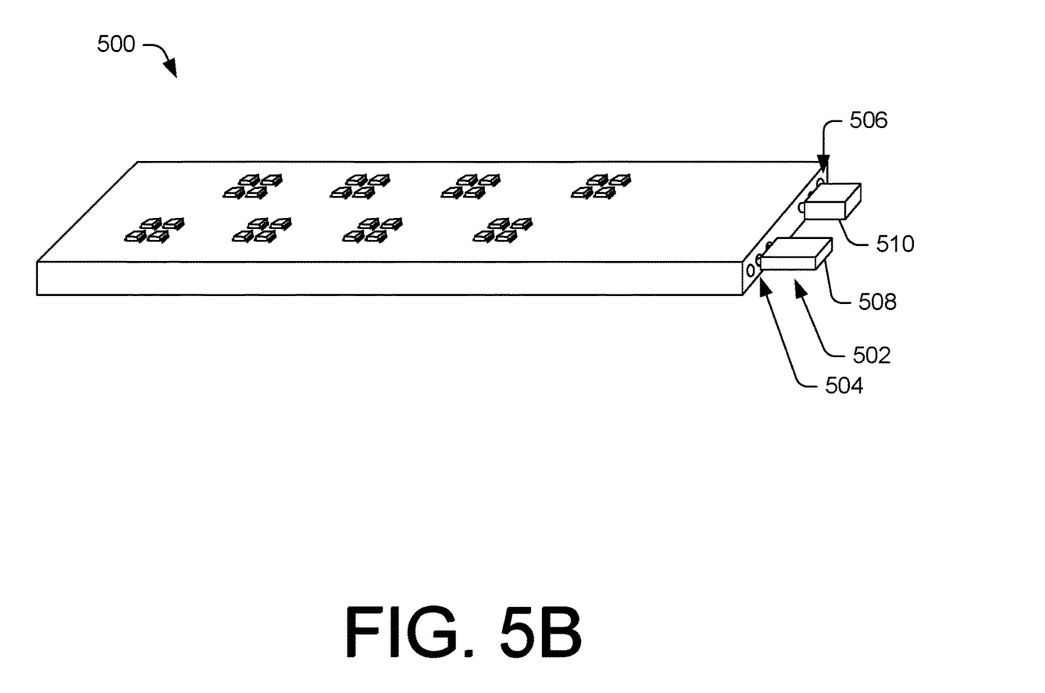

FIGS. 5A and 5B show perspective views of different components coupled to embedded lateral connectors. FIG. 5A shows a PCB 500 that includes embedded lateral connectors 502. For example, the embedded lateral connectors 502 may include a first set of embedded lateral connectors 504 and a second set of embedded lateral connectors 506. In some embodiments, the first set of embedded lateral connectors 504 may be a different type of connector than the second set of embedded lateral connectors 506, such as male-type connectors versus female-type connectors, or selected from any other type of connector described above. FIG. 5A also shows a first component 508 and a second component 510 configured to be coupled to the first set of embedded lateral connectors 504 and the second set of embedded lateral connectors 506, respectively.

FIG. 5B shows the PCB 500 coupled to the first component 508 and the second component 510. The first component 508 is coupled to the first set of embedded lateral connectors 504 while the second component 510 is coupled to the second set of embedded lateral connectors 506.

Figure 6A:
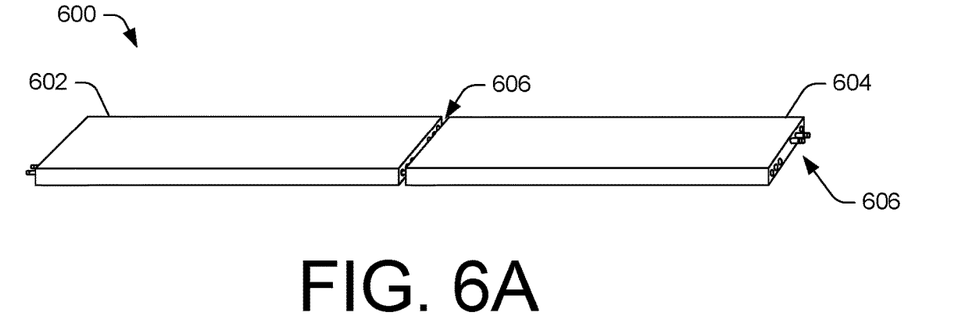
FIGS. 6A-6C show perspective views of PCBs electrically connected using embedded lateral connectors.
Figure 6B:
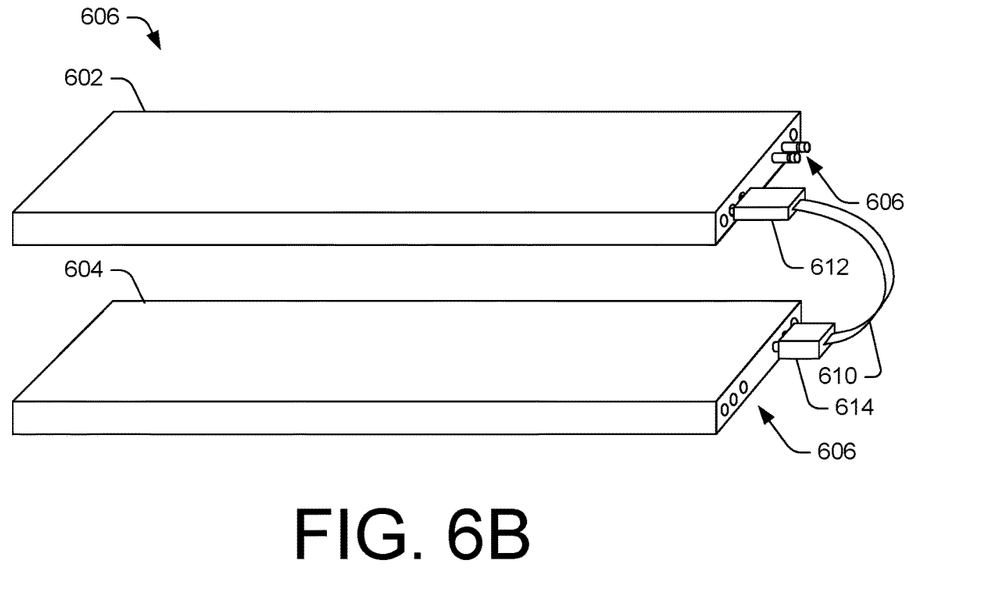
Figure 6C:
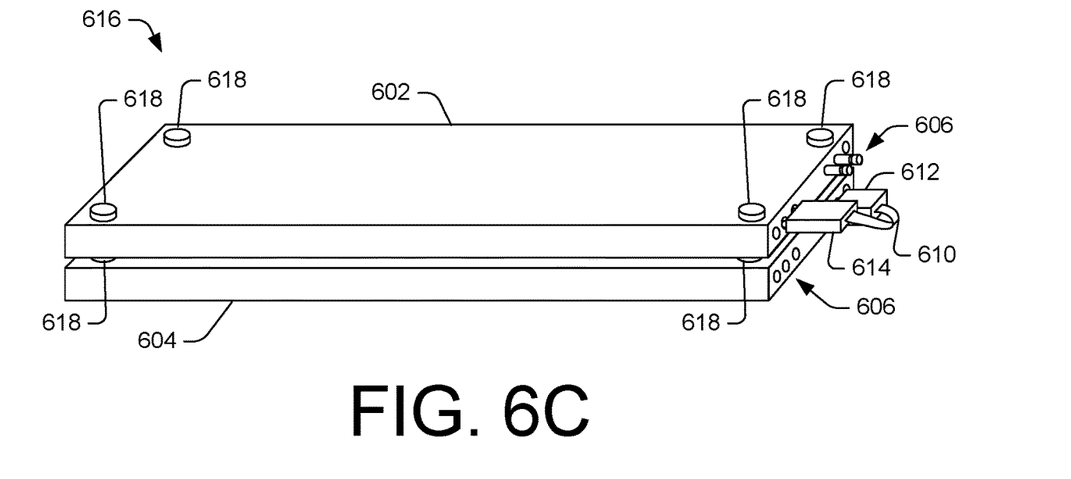

FIGS. 6A-6C show perspective views of PCBs electrically connected using embedded lateral connectors.

FIG. 6A shows a perspective view of a first assembly 600 of PCBs, including a first PCB 602 and a second PCB 604. The first PCB 602 and the second PCB 604 may include one or more embedded lateral connectors 606, as described above. The first PCB 602 may be electrically connected to the second PCB 604 by coupling first embedded lateral connectors of the first PCB 602 directly to second embedded lateral connectors of the second PCB 604. By connecting PCBs in this manner, the PCBs may exchange information and/or electrical signals and may possibly operate in a similar way as a larger PCB that encompasses all components and circuitry of the first PCB 602 and the second PCB 604. In some embodiments, the embedded lateral connectors may operate as a multi-pin connector to facilitate exchange of different signals between the first and second PCB. Additional PCBs may be connected to additional embedded lateral connectors on the first or second PCB.

FIG. 6B shows a perspective view of a second assembly 608 of PCBs in a stacked configuration, including the first PCB 602 and the second PCB 604. The first PCB 602 and the second PCB 604 may include one or more embedded lateral connectors 606, as described above. The first PCB 602 may be electrically connected to the second PCB 604 by coupling first embedded lateral connectors of the first PCB 602 to second embedded lateral connectors of the second PCB 604 using an adapter 610. The adapter 610 may include a first adapter end 612 and a second adapter end 614 that each include connectors configured to couple to respective embedded lateral connectors 606 of the first PCB 602 and the second PCB 604, respectively. By connecting PCBs in this manner, the PCBs may exchange information and/or electrical signals and may possibly operate in a similar way as a larger PCB that encompasses all components and circuitry of the first PCB 602 and the second PCB 604. In some embodiments, the embedded lateral connectors may operate as a multi-pin connector to facilitate exchange of different signals between the first and second PCB. Additional PCBs may be connected to additional embedded lateral connectors on the first or second PCB.

FIG. 6C shows a perspective view of a third assembly 616 of PCBs in a stacked and coupled configuration, including the first PCB 602 and the second PCB 604. In various embodiments, the first PCB 602, the second PCB 604, or both may include spacers 618 on the planar surfaces of the PCBs. The spacers 618 may create an offset between adjacent PCBs and/or may couple the PCBs, such as by engaging in corresponding features. The first PCB 602 and the second PCB 604 may include one or more embedded lateral connectors 606, as described above. The first PCB 602 may be electrically connected to the second PCB 604 by coupling first embedded lateral connectors of the first PCB 602 to second embedded lateral connectors of the second PCB 604 using the adapter 610. The adapter 610 may include a first adapter end 612 and a second adapter end 614 that each include connectors configured to couple to respective embedded lateral connectors 606 of the first PCB 602 and the second PCB 604, respectively. By connecting PCBs in this manner, the PCBs may exchange information and/or electrical signals and may possibly operate in a similar way as a larger PCB that encompasses all components and circuitry of the first PCB 602 and the second PCB 604. In some embodiments, the embedded lateral connectors may operate as a multi-pin connector to facilitate exchange of different signals between the first and second PCB. Additional PCBs may be connected to additional embedded lateral connectors on the first or second PCB.

In accordance with various embodiments, an electronic device ma include a housing, a PCB, a connector, and a component. The PCB may include a plurality of layers, each layer having a planar side that mates with an adjacent layer of the plurality of layers. The PCB may include a connector embedded between at least some of the layers. The connector may be oriented such that a longitudinal axis of the connector is parallel with the planar side. The connector may be configured to receive a corresponding connector to create an electrical connection to at least some of the plurality of layers via the connector. The component may be coupled to the PCB by the connector.

In various embodiment, the component is a different PCB. The PCB and the different PCB may be arranged in a stacked configuration, possibly using the spaces to create an offset between the PCBs and/or couple the PCBs to one another.

The electronic device may include a power source. The electrical connection may include connection to the power source.

The electronic device may include mounting features coupled to a lateral side of the PCB and at least partly located between at least some of the plurality of layers. The mounting feature may include an aperture and coupling features to facilitate coupling to the housing. For example, screws may retain the PCB to the housing via the mounting features In some embodiments, the connector includes an aperture, and an opening of the aperture aligns with a lateral side PCB. The connector may be configured to engage a corresponding connector. The aperture may include at least partially concave sidewalls that form recesses to retain a plug. A seal may be positioned adjacent to the opening of the aperture and adjacent to a lateral side of the PCB. The seal may prevent environmental debris from entering an aperture of the connector.

In accordance with one or more embodiments, the connector may include an elongated body that extends outward and beyond a lateral side of the PCB. The elongated portion may include a tip and at least one ring. The PCB may include a second connector embedded between at least some of the layers. The second connector may be oriented such that a longitudinal axis of the second connector is parallel with the planar side. The second connector may be configured to receive a different corresponding connector to create a different electrical connection to at least some of the plurality of layers via the second connector. The first connector may include a different shape than the second connector.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. A method comprising:
  forming an inner layer of a printed circuit board (PCB) that includes a first planar side and a second planar side opposite the first planar side;
  coupling a connector to the inner layer, the connector having an elongated body with a longitudinal axis that is oriented parallel with the first planar side, the elongated body extending outward and beyond a lateral side of the PCB;
  coupling a first set of one or more layers to the first planar side of the inner layer;
  coupling a second set of one or more layers to the second planar side of the inner layer; and
  adhering the inner layer to the first set of one or more layers and to the second set of one or more layers to form the PCB having the connector embedded laterally in the PCB, wherein an outermost layer of PCB includes a spacing feature configured to engage an adjacent PCB, the spacing feature to create a predefined gap between the PCB and the adjacent PCB.

2. The method as recited in claim 1, wherein the connector includes one or more contacts that create an electrical connection between the inner layer and the connector, and wherein the one or more contacts are further configured to engage a corresponding connector of a different PCB.

3. The method as recited in claim 1, wherein the elongated body has a first height relative to the first planar side at a first point along the longitudinal axis and a second height relative to the first planar side that is different than the first height at a second point along the longitudinal axis.

4. The method as recited in claim 1, further comprising connecting the PCB to the adjacent PCB via the connector and a second connector of the adjacent PCB, the second connector being recessed within the PCB.

5. The method as recited in claim 1, wherein the elongated body of the connector includes a tip and at least one ring.

6. The method as recited in claim 1, wherein the inner layer includes a layer aperture configured to receive the connector, and wherein coupling the connector to the inner layer includes coupling the connector to the inner layer within the layer aperture.

7. The method as recited in claim 6, further comprising forming the layer aperture using at least one of a die cutting process or an additive manufacturing process that omits adding material in a location to form the layer aperture.

8. A printed circuit board (PCB) comprising:
  a plurality of layers, at least one layer of the plurality of layers having a planar side that connects to an adjacent layer of the plurality of layers; and
  a connector embedded between at least some layers of the plurality of layers, the connector having an elongated body that extends outward and beyond a lateral side of the PCB, wherein a height of the elongated body relative to the planar side varies along the elongated body.

9. The PCB as recited in claim 8, wherein the connector includes one or more contacts that create an electrical connection between a layer of the plurality of layers and the connector, and wherein the one or more contacts are further configured to engage a corresponding connector of a different PCB.

10. The PCB as recited in claim 8, further comprising a mounting feature coupled to the lateral side of the PCB and at least partly located between at least some layers of the plurality of layers, the mounting feature including an aperture and one or more threads to facilitate mounting the PCB on a housing.

11. The PCB as recited in claim 8, wherein an outermost layer of the plurality of layers includes a spacing feature configured to engage an adjacent PCB, the spacing feature to create a predefined gap between the PCB and the adjacent PCB.

12. The PCB as recited in claim 8, wherein the connector is a first connector, and further comprising a second connector embedded between at least some layers of the plurality of layers, the second connector oriented such that a longitudinal axis of the second connector is parallel with the planar side.

13. The PCB as recited in claim 12, wherein the first connector is a first shape that is different than a second shape of the second connector.

14. An electronic device comprising:
  a housing;
  a printed circuit board (PCB) including:
    a plurality of layers, at least one layer of the plurality of layers having a planar side that connects to an adjacent layer of the plurality of layers; and
    a connector embedded between at least some layers of the plurality of layers, the connector having an elongated body that extends outward and beyond a lateral side of the PCB;
  a component coupled to the PCB by the connector; and
  a mounting feature coupled to the lateral side of the PCB and at least partly located between at least two layers of the plurality of layers, the mounting feature including an aperture and one or more coupling features to facilitate mounting of the PCB on the housing.

15. The electronic device as recited in claim 14, wherein the component is a different PCB.

16. The electronic device as recited in claim 14, wherein the elongated body has a first height relative to the planar side at a first point along a longitudinal axis of the connector and a second, different height relative to the planar side at a second point along the longitudinal axis of the connector.

17. The electronic device as recited in claim 14, wherein the connector includes one or more contacts that create an electrical connection between a layer of the plurality of layers and the connector, the one or more contacts further configured to engage the component.

18. The electronic device as recited in claim 17, further comprising a power source, and wherein the electrical connection includes a connection to the power source.

19. The electronic device as recited in claim 14, wherein the connector is a first connector, and further comprising a second connector embedded between at least some layers of the plurality of layers, the second connector oriented such that a longitudinal axis of the second connector is parallel with the planar side.

20. The electronic device as recited in claim 19, wherein the first connector is a first shape that is different than a second shape of the second connector.

* * * * *